US007234234B2

(12) United States Patent
Saito et al.

(10) Patent No.: US 7,234,234 B2
(45) Date of Patent: Jun. 26, 2007

(54) METHOD OF MANUFACTURING BANDPASS FILTERS FOR GHZ BANDS

(75) Inventors: Akihiko Saito, Nagoya (JP); Hiroshi Haizuka, Nakatsugawa (JP)

(73) Assignees: Daido Steel Co., Ltd., Aichi-ken (JP); Daido Electronics Co., Ltd., Gifu-ken (JP)

( * ) Notice: Subject to any disclaimer, the term of this patent is extended or adjusted under 35 U.S.C. 154(b) by 413 days.

(21) Appl. No.: 10/980,176

(22) Filed: Nov. 4, 2004

(65) Prior Publication Data

US 2005/0101285 A1 May 12, 2005

(30) Foreign Application Priority Data

Nov. 6, 2003 (JP) ............................ 2003-377298

(51) Int. Cl.
*H05K 3/02* (2006.01)

(52) U.S. Cl. ............................ 29/847; 29/829; 29/846; 264/272.11; 264/272.12; 264/454; 264/478; 333/175; 333/185; 333/204; 455/339

(58) Field of Classification Search .................. 29/847, 29/829, 846, 848; 264/272.11, 272.12, 454, 264/478; 333/175, 185, 204; 455/339
See application file for complete search history.

(56) References Cited

U.S. PATENT DOCUMENTS 6,650,203 B2 * 11/2003 Gerstenberg et al. ....... 333/185

FOREIGN PATENT DOCUMENTS

JP 2001-339203 * 12/2001

* cited by examiner

*Primary Examiner*—A. Dexter Tugbang
*Assistant Examiner*—Tim Phan
(74) *Attorney, Agent, or Firm*—Westerman, Hattori, Daniels & Adrian, LLP.

(57) ABSTRACT

Disclosed is a method of manufacturing a BPF (bandpass filter) for GHz bands of the structure that an input signal line (2) and an output signal line (3) run with a small gap on one surface of a sheet (1) made by dispersing soft magnetic metal powder in a sheet-formed polymer matrix, an internal line (6) bridges on the signal lines, and a GND line (4) runs on the reverse surface of the sheet. The method comprises inserting an intermediate product made by disposing on both the sides of an insulating film (5) the above-mentioned input signal line (2), output signal line (3) and internal line (6), on one side of the cavity of a mold for injection, and inserting a metal piece for the GND line (4) on the other side of the cavity; and injecting a polymer compound to obtain a molded article.

7 Claims, 3 Drawing Sheets

METHOD OF MANUFACTURING BANDPASS FILTERS FOR GHZ BANDS

CROSS REFERENCE TO RELATED DOCUMENTS

This application claims priority to Japanese Application No. 2003-377298, filed on Nov. 6, 2003.

BACKGROUND OF THE INVENTION

1. Technical Field

The present invention concerns a method of manufacturing bandpass filters to be used in GHz bands, particularly, some hundreds of MHz to ten and some GHz bands. (Hereinafter "bandpass filter" is abbreviated to "BPF".)

2. Prior Art

In these days radio wave in the frequency regions of some hundreds MHz to ten and some GHz has been preferred. For example, 800 MHz (0.8 GHz) band or 1.5 GHz band for mobile telephone, 1.9 GHz band for PHS (Personal Handy-phone System), 5.8 GHz band for ETC (Electronic Toll Collection System), 2.4 GHz band or 5.2 GHz band for wireless PAN (Personal Area Network) and 5.8 GHz band for DSRC (Dedicated Short Range Communication).

Because the radio waves in these frequency regions are all used or may be possibly used for operation of automobiles, it has been intended to receive the radio waves with one antenna and treat by digital processing. For such occasions and for the cases where the waves of the respective frequency regions are solely used, for the purpose of cutting noise caused by harmonics or reflected waves before treating the date, it is necessary to use a bandpass filter which passes only the signal of a determined band width in respective bands and cuts the other signal.

On the other hand, trial has been made to carry out ultra wideband transmission by using short (nanometers or less) pulse without using carrier waves. As the frequency region for this communication FCC (Federal Communication Committee) of the United States decided to assign 3.1–10.6 GHz. If a BPF which enables bandpassing of this ultra wideband region, particularly, that of small and low loss is provided, it will be useful for the devices realizing the above mentioned ultra wideband communication.

One of the inventors invented various types of electromagnetic wave-shielding materials prepared by dispersing powder of soft magnetic substances in a matrix of elastomeric or plastic substances, which are already in practical use. He also invented a low-pass (high-cut) filter using this electromagnetic wave-shielding material and disclosed (Japanese Patent Disclosure 2002-171104). The filter is of chip-type and characterized in that it has the structure of one signal line of a conductive material and at least one GND line are disposed in parallel direction on one surface or both the surfaces of a square plate of dielectric substance and that, as the dielectric substance, an electromagnetic wave-absorbing material prepared by dispersing a soft magnetic powder in a synthetic resin matrix is used. The product of this invention exhibits insertion loss of −5 dB for high frequency wave of 1 GHz or higher.

Also, the other of the inventors utilized the knowledge mentioned above to invent a BPF for GHz bands, which is used in the frequency region of some hundreds of MHz to ten and some GHz, and already proposed (Japanese Patent Disclosure 2004-222086). The BPF for GHz bands has a structure that, in principal, an input signal line and an output signal line made of conductive strips are disposed to run in series direction with a small gap between them on one side of a sheet, which is prepared by dispersing soft magnetic metal powder in a polymer matrix, that the opposite ends of the above signal lines are connected with a capacitance means, and that a GND line is disposed on the reverse side of the sheet.

A concrete example of the above-mentioned structure is shown in FIG. 1. The BPF for GHz bands is made by disposing an input signal line (2) and an output signal line (3) made of conductive strips so that both the signal lines may run in the series direction with a small gap between them on the sheet (1), which is prepared by dispersing soft magnetic metal powder in a sheet-formed polymer matrix, connecting the opposite ends of both the signal lines with a capacitance means, and disposing a GND line (4) on the reverse side of the sheet (1). The BPF is characterized in that the capacitance means is formed by laminating an internal line (6), which is also made of a conductive strip, with intermediation of an insulating film (5) in such a manner that the internal line bridges the input signal line and the output signal line so that electrostatic capacitance may be formed both between the input signal line and the internal line and between the internal line and the output signal line. The passing-band of this BPF can be varied by choosing the respective electrostatic capacitance, the impedance determined by the lengths, widths, thicknesses and forms of the input signal line (2) and the output signal line (3), as well as the conditions of particle form of the soft magnetic metal powder, filling rate in the matrix of the powder, and the form and thickness of the sheet.

The BPF for GHz bands mentioned above has frequency characteristics of permeability as shown in FIG. 2. This type of BPF is advantageous because of the simple structure, and hence, it can be manufactured in small sizes. However, automation of manufacturing is not easy and it is difficult to meet the demand for cost saving. Further, the BPF has the problem of low percentage of passing the standard due to the fact that, if the values of the electrostatic capacity and the impedance of the BPF are not accurate, desired frequency characteristics cannot be obtained.

SUMMARY OF THE INVENTION

Figure 1A:
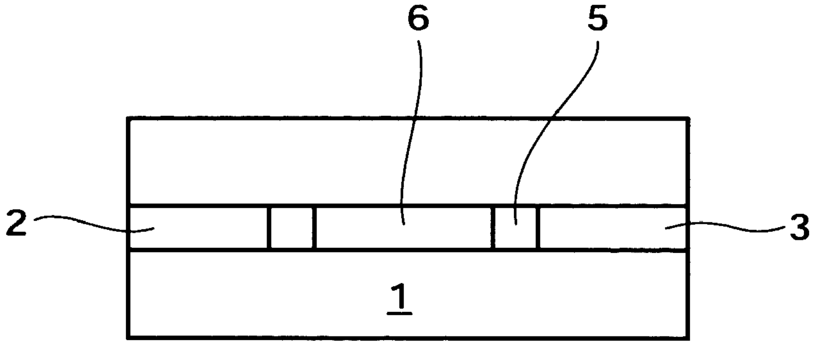
FIG. 1A is a plan view of the BPF for GHz bands disclosed in the above-mentioned Japanese Patent Disclosure 2004-222086.

The object of the present invention is to provide a method of manufacturing the BPF for GHz bands having the above-explained structure, which may be easily automated, and hence, with low costs, and by which the desires frequency characteristics as well as the high rate of passing the standards may be easily achieved.

The method of manufacturing the BPF for GHz bands of the invention comprises: disposing an input signal line (2) and an output signal line (3) made of conductive strips running in the series direction with a small gap between them on a surface of a sheet (1) made by dispersing soft magnetic metal powder in a sheet-formed polymer matrix, piling an internal line (6) made of a conductive strip with intermediation of an insulating film (5) in such a manner that the internal line bridges on both the opposite ends of the input signal line and the output signal line, and disposing a GND line (4) on the reverse surface of the above-sheet (1). The present method of manufacturing is characterized by the steps of inserting an intermediate product made by disposing the above-mentioned input signal line (2), output signal line (3) and internal line (6) on one side of the cavity of a mold for injection, inserting a metal piece for the GND line (4) on the other side of the cavity of the mold, and injection molding a polymer compound prepared by dispersing soft magnetic metal powder in the polymer so as to obtain a molded article in which the above components are consolidated.

The method of manufacturing according to the invention employs the step of etching copper foils adhered on a film followed by insert-injection molding and thus a BPF for GHz bands is produced by one step. Remarkable increase in productivity makes the cost greatly decreased. Injection molding is a technology appropriate for mass-production of standardized products, and therefore, frequency characteristics of the BPF for GHz bands produced by the method according to the invention is guaranteed to be stable and the rate of acceptable products is high. The known method of manufacturing BPFs uses the steps of sheet formation of polymer material in which soft magnetic metal powder is dispersed and laminating an etched product on the sheet with an adhesive. The sequence of the production steps is inefficient and suffers from scattered characteristics of the products. The present method solved these problems.

DETAILED EXPLANATION OF THE PREFERRED EMBODIMENTS

For preparation of the intermediate product by disposing the input signal line (2), the output signal line (3) and the internal line (6) on the film insulating (5) it is recommended to laminate copper foils of 10-40 μm thick, typically about 20 μm thick, with an adhesive such as epoxide resin adhesive on both the sides of a polyimide film of 100–500 μm thick, typically about 25 μm thick, or glass-epoxide resin film of 100–200 μm thick, and to etch the copper foils. This method is simple and convenient.

The soft magnetic metal powder may be chosen from those disclosed in the above-mentioned Japanese Patent Disclosure 2002-171104. Typical one is powder of Fe-13Cr alloy having averaged particle size of 3–20 μm. Further examples are powder of Permalloy or Sendust, and powder of ferrites.

As the polymer in which the soft magnetic metal powder is dispersed any polymer, which is thermoplastic and formable by injection molding, may be used. Examples of useful polymers are: polyethylene, polypropylene, polystyrene, polyvinylchloride, ABS resin, polyacetal, polyphenylene ether, polyethylene terephthalate, polybutylene terephthalate, polysulfone, polyphenylene sulfide and polyether imide. Particularly, polyphenylene sulfide is the most suitable. It is preferable to add suitable amount of filler, which is powder of an inorganic substance such as calcium carbonate, so as to enhance the mechanical strength of the molded product.

Figure 5A:
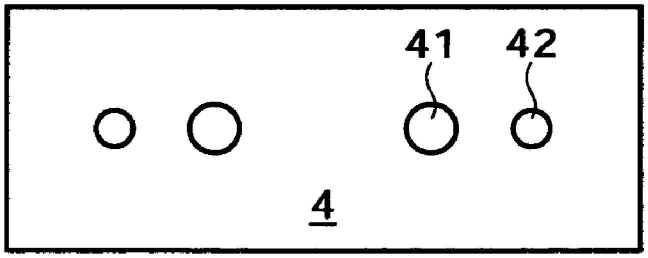
FIG. 5A is a plan view of a metal piece for GND line used for the BPF for GHZ bands shown in FIG. 3.

For the material of the metal piece to be the GND line (4) phosphor bronze may be conveniently used because of its proper strength. In any event of the material for the metal piece, it is advantageous to carry out the injection molding by injecting the polymer containing soft magnetic metal powder into the mold through a hole provided in the metal piece. In this case, it is preferable to provide a hole (42) having reverse taper other than the above-mentioned hole (41) for the injection molding, through which the polymer compound is injected, as shown in FIG. 5A so that the polymer compound injected in the mold may invade into the hole (42) and secure consolidation of the molded products.

Figure 1B:
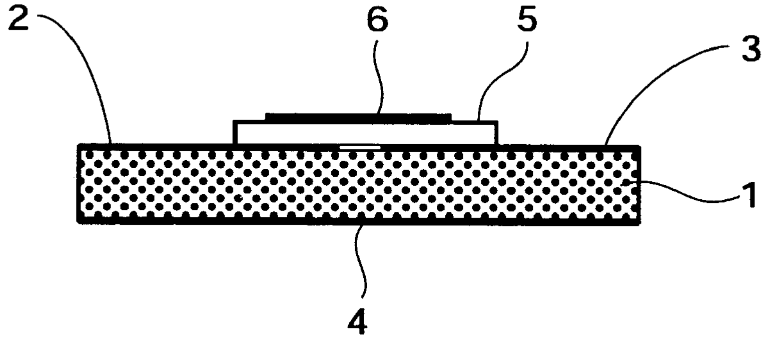
FIG. 1B is a vertical cross section view of the BPF shown in FIG. 1A.

For practicing the present invention it is useful to observe the indications disclosed in the above-mentioned Japanese Patent Disclosure 2004-222086. For instance, the knowledge described in the literature that, in the most simple type of BPF for GHz bands as shown in FIG. 1 of the literature, the relation between the "notch frequency" f(GHz) and the overlapping length L(cm) of the internal line (6) with the input signal line (2) and the output signal line (3) will be, if the dimensions of the parts of the BPF are those manufactured in Example 2 of the literature:

$$f(\mathrm{GHz})=75\times 1/K\cdot L(\mathrm{mm})$$

Various embodiments are possible in practicing this invention. For example, instead of the metal piece for GND line a circuit board itself may be used. In such a case, the circuit board is used as one component of the mold for injection molding, have this component placed in the opposite location to the other component which is the above-mentioned intermediate product comprising the insulating film (5) on which the input signal line (2), the output signal line (3) and the internal line (6) are disposed, and the polymer compound is injected between the components.

EXAMPLES

Figure 3:
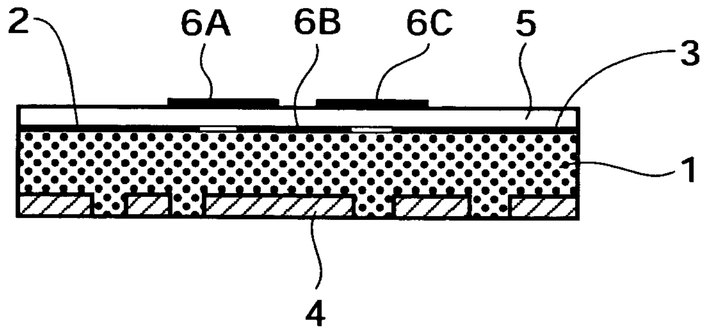
FIG. 3 is a vertical section view of a BPF for GHz bands produced in the working example of the invention.
Figure 2:
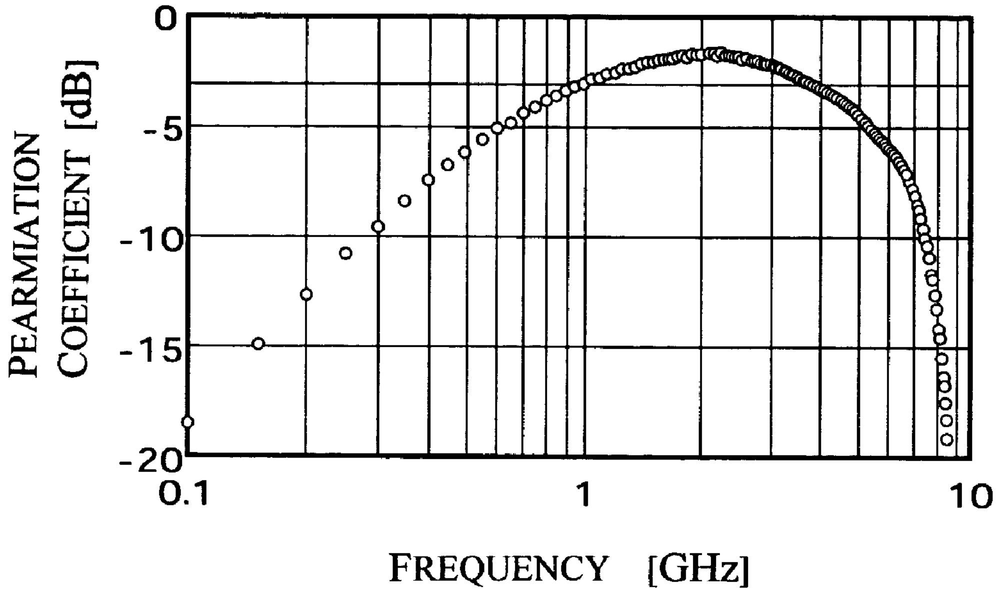
FIG. 2 is a graph showing frequency characteristics of permeable coefficient of the BPF for GHz bands of the structure shown in FIGS. 1A and 1B.

A BPF for GHz bands of the cross-section structure illustrated in FIG. 3 was manufactured by the method according to the invention. This BPF has plural internal lines (6) between the input signal line (2) and the output signal line (3), and electrostatic capacitance occurs not only between the input signal line (2) and the internal line (6A) and between the internal line (6C) and the output signal line (3), but also between the internal lines (6A and 6B, 6B and 6C). This structure gives sharp curve of band cutting characteristics, i.e., sharp band-passing characteristics.

Figure 4A:
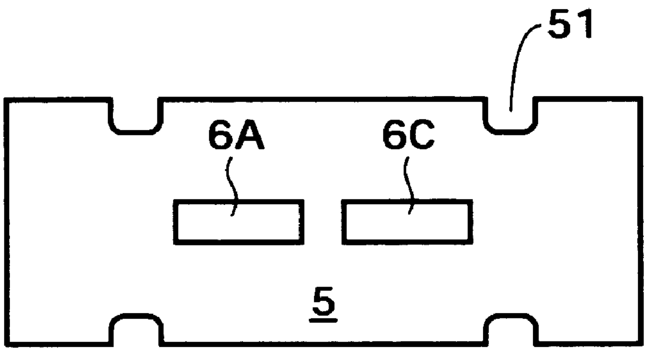
FIG. 4A is a plan view of the film surface showing the circuit pattern used for production of BPF for GHz bands.
Figure 4B:
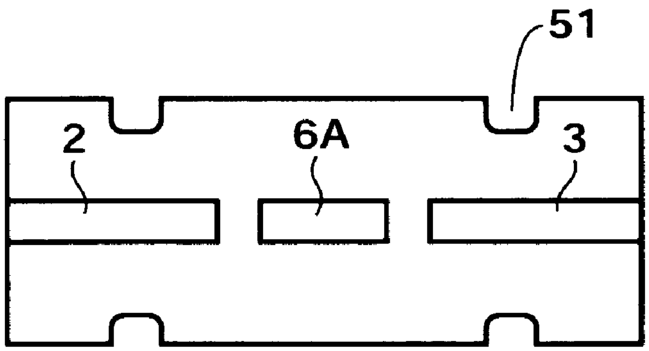
FIG. 4B is a plan view of the reverse side of the film shown in FIG. 4A.

Copper foils of 20 μm thick were adhered on both the surfaces of a polyimide resin film of 25 μm thick with an epoxide-resin adhesive, and etching was carried out to form a circuit (the input signal line, the internal lines and the output signal line) of the top surface pattern as shown in FIG. 4A and the reverse surface pattern as shown in FIG. 4B (the input signal line, the internal lines and the output signal line). As seen in the Figures two notches on both the sides of the film (51) are given for the purpose of fitting the circuit film to a separator, which is provided on the mold for injection when a metal piece to be the GND line (4) is inserted in the mold.

Figure 5B:
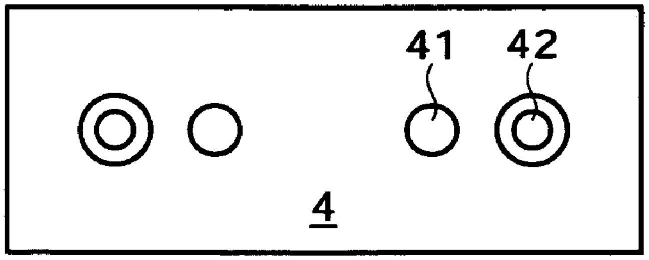
FIG. 5B is a plan view of the reverse side of the metal piece shown in FIG. 5A.

Separately, a phosphor bronze sheet of 0.5 mm thick was machined to the shape shown in FIG. 5A and FIG. 5B, and the holes as illustrated were made. As the soft magnetic metal material powder of averaged particle size of 8 μm made of Fe-13Cr alloy was used.

Polyphenylene-sulfide resin, to which calcium carbonate is added, was used as the matrix material, and the above soft magnetic metal powder was compounded thereto with the filling percentage of 10% by volume. The above circuit pattern was set on one part of the mold with the top surface contacted to the mold, the phosphor bronze sheet on the other part of the mold, and the polymer mixture melted by an extruder was injected between the above-mentioned two components. Thus, a consolidated product, a BPF for GHz bands according to the invention, was manufactured.

Figure 6:
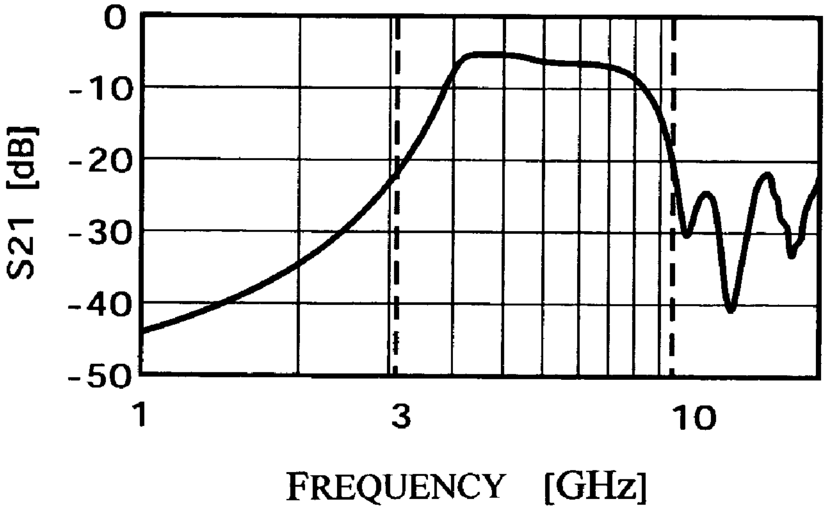
FIG. 6 is a graph showing the S21 characteristic of the BPF for GHz bands produced in the working example of the present invention.

The S21 permeation characteristics (dB) of the above-produced BPF for GHz bands were determined in the frequency range from 0.1 GHz (100 MHz) to 10 GHz using a "Network Analyzer" made by Japan HP. The observed values were plotted to FIG. 6. From this graph it is seen that the above-manufactured BPF has the characteristics that causes attenuation of −20 dB or more to the frequency of 3 GHz or lower and that of 11 GHz or higher, and thus, it is concluded that this BPF is useful as an UWBPF (ultrawide bandpass filter) used for passing the waves of 3.1–10.6 GHz.

The BPFs for GHz bands manufactured according to the present method have, as the BPF to be used in the frequency range of some hundreds MHz to ten and some GHz, wide use in various technical fields such as mobile telephones, PHS, ETC, wireless PAN and DSRC for the purpose of passing waves of desired frequency range and cutting the other waves. Particularly, the present BPF is suitable for passing the wave of 3.1–10.6 GH, which is designated by FCC as the band of UWB communication.

We claim:

1. A method of manufacturing a bandpass filter for GHz bands having the structure that an input signal line (2) and an output signal line (3) made of conductive strips run in the series direction with a small gap between them on a surface of a sheet (1), which is made by dispersing soft magnetic metal powder in a sheet-formed polymer matrix; that an internal line (6) made of a conductive strip is piled on both the opposite ends of the input signal line and the output signal line to bridge them with intermediation of an insulating film (5) so that electrostatic capacitance may occur between the internal line and the input signal line, and the internal line and the output signal line; and that a GND line (4) run on the reverse surface of the above-sheet (1); the method comprises the steps of inserting an intermediate product, which is made by disposing on both the sides of an insulating film (5) the above-mentioned input signal line (2), output signal line (3) and internal line (6), on one side of the cavity of a mold for injection; inserting a metal piece for the GND line (4) on the other side of the cavity of the mold; and injecting a polymer compound prepared by dispersing soft magnetic metal powder in the polymer into the mold so as to obtain a molded article in which the above components are consolidated.

2. The method of claim 1, wherein the intermediate product, which is made by disposing on both the sides of an insulating film (5) the above-mentioned input signal line (2), output signal line (3) and internal line (6), is made by etching copper foils adhered on both the side of a polyimide resin film.

3. The method of claim 1, wherein a phosphor bronze sheet is used as the metal piece to be the GND line (4).

4. The method of claim 1, wherein the polymer in which soft magnetic metal powder is dispersed is a compound of polyphenylene sulfide resin in which the soft magnetic metal powder is dispersed together with powder of an inorganic substance.

5. The method of claim 1, wherein the soft magnetic metal powder is powder selected from the powders of Fe-13Cr alloy, Permalloy and Sendust, and the powder of the inorganic substance is powder of calcium carbonate.

6. The method of claim 1, wherein the injection of the polymer in which the soft magnetic metal powder is dispersed is carried out through the hole (41) for injection molding provided in the metal piece for the GND line so as to have the polymer invaded into the hole (42) having reverse taper and to ensure consolidation of the molded article.

7. The method of claim 1, wherein three or more internal lines are disposed so that electrostatic capacitance may occur between the internal lines.

* * * * *